(12) United States Patent
Barbara (10) Patent No.: US 6,255,824 B1
(45) Date of Patent: Jul. 3, 2001

(54) GRADIENT COILS FOR MAGIC ANGLE SPINNING SAMPLES

(75) Inventor: Thomas M. Barbara, Mountain View, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/274,750

(22) Filed: Mar. 23, 1999

(51) Int. Cl.[7] ................................................. G01R 33/00
(52) U.S. Cl. ............................................................ 324/321
(58) Field of Search ................................. 324/321, 318, 324/307, 309

(56) References Cited

U.S. PATENT DOCUMENTS 5,872,452   2/1999   Cory et al. .......................... 324/321

OTHER PUBLICATIONS

Article by Bowtell et al., entitled "Magic–Angle Gradient–Coil Design," published in *Journal of Magnetic Resonance* in 1995, Series A 115, pp. 55–59.

Article by W.E. Maas et al., entitled "Gradient, High Resolution, Magic Angle Sample Spinning NMR," published in *J. Am. Chem. Soc.* in 1996, in vol. 118, pp. 13085–13086.

Article by R. Turner, entitled "A target field approach to optimal coil design," published in *J. Phys D: Appl. Phys.* 19 in 1986, pp. L147–L151.

Primary Examiner—Christine Oda
Assistant Examiner—Dixomara Vargas
(74) Attorney, Agent, or Firm—Edward H. Berkowitz (57) ABSTRACT

A coil set and its design is described for obtaining a magnetic field gradient oriented at a desired angle to a uniform magnetic field wherein the coils set is disposed on a cylinder with axis along the desired gradient direction.

6 Claims, 8 Drawing Sheets

GRADIENT COILS FOR MAGIC ANGLE SPINNING SAMPLES

FIELD OF THE INVENTION

The invention is in the field of nuclear magnetic resonance (NMR) and more particularly relates to NMR probes capable of generating a magnetic field gradient along the axis of a sample oriented at a selected angle with respect to a polarizing field.

BACKGROUND OF THE INVENTION

It is a standard procedure of analysis by magnetic resonance to rotate a sample at a high rate in a uniform field to obtain an improved average homogeneous sample volume. It is also characteristic of certain specific experiments to orient the rotational axis at a selected angle with respect to the polarizing field. In recent years, the employment of pulsed magnetic field gradients has been introduced for purposes such as solvent suppression or for the detection of multi-quantum coherence.

The combination of these arrangements requires an NMR probe which can supply a desired magnetic field gradient over a sample at specified orientation with respect to a uniform magnetic field.

In the prior art, Bowtell and Peters, J. Mag. Res., series 115, pp.55–59 (1995), describe a design for a gradient coil oriented at the "magic angle" comprising wires disposed as contours on the surface of a cylinder axially coincident with a spinning axis and the spinning axis oriented along the polarizing field. This gradient coil is best described as disposed on the planar surface having dimensions extending from $-z_0$ to $+z_0$ by $-r\phi$ to $+r\phi$ formed by unrolling the cylindrical surface. For the purposes of this work the z direction will be taken as the axis of the cylinder rather than the direction of the polarizing field. The angle $\phi$ is the azimuthal angle about the periphery of the cylinder. It is important to note that this prior art places the axis of the rotating sample (coincident with the polarizing axis) while the gradient is designed to be directed at the magic angle with respect to the (coincident) polarizing/rotational axis.

In another example of prior art, a gradient coil is described for disposition on a cylindrical surface oriented at an angle with respect to the polarizing field and producing a gradient having a linear dependence of magnetic field component $B_p$ in the polarizing field direction as a function of displacement along the rotational axis z, while maintaining uniform gradient field in the plane perpendicular to the rotational axis. This is obtained with parallel straight line segments disposed to lie in approximately cylindrical distribution and with appropriately selected currents directed through the several segments. This is described in U.S. Pat. No. 5,872,452 to Cory et al. Note that for this approach currents which would be required to produce a field derived from a theoretical infinitely long cylinder must be adapted to the actual available dimensions of an NMR probe. This truncation, in turn, must be considered for the effect upon the resulting gradient.

SUMMARY OF THE INVENTION

The present invention provides a magnetic field gradient disposed at a selected orientation with respect to a uniform magnetic field direction. The gradient field is obtained from a family of coils disposed on the surface of a cylinder with cylindrical axis coincident with the desired orientation. The field is designed to exhibit a substantially linear gradient along the desired orientation for the computed geometry and values of the current paths comprising such coils. The end effects of a truncated geometry are explicitly taken into account.

DETAILED DESCRIPTION OF THE INVENTION

The current interest in magic angle gradient coils originated from applications involving water suppression in DQF-COSY and the use of MAS to obtain high resolution spectra from small sample volumes (2) or heterogeneous liquid environments. Magic angle gradient coils for water suppression employ the standard high resolution sample geometry where the sample axis is along the polarizing magnetic field direction and the gradient currents are wound on cylindrical formers coaxial with both. Such gradients can be produced by superimposing standard Z gradient coils with transverse X or Y gradients, or they can be designed using an integrated winding coils with transverse X or Y gradients, or they can be designed using an integrated winding pattern determined by target fields as proposed by Bowtell and Peters. The same type of design can in principle be used for MAS experiments where the sample axis is at the magic angle with respect to the polarizing field and rotates about that axis. This approach however suffers from poor efficiency and precludes easy sample access. The alternative of winding a Maxwell Pair around the sample will also be inefficient since only the projection of the gradient field along the polarizing field will contribute. For the same reason, large spinning modulation effects will arise from the radial component of the magnetic field produced by the coil.

In this discussion, the reference to the magic angle is for illustrative purposes. The desired gradient producing coils may be designed for a selected angle with respect to another (uniform) magnetic field direction.

Figure 1:
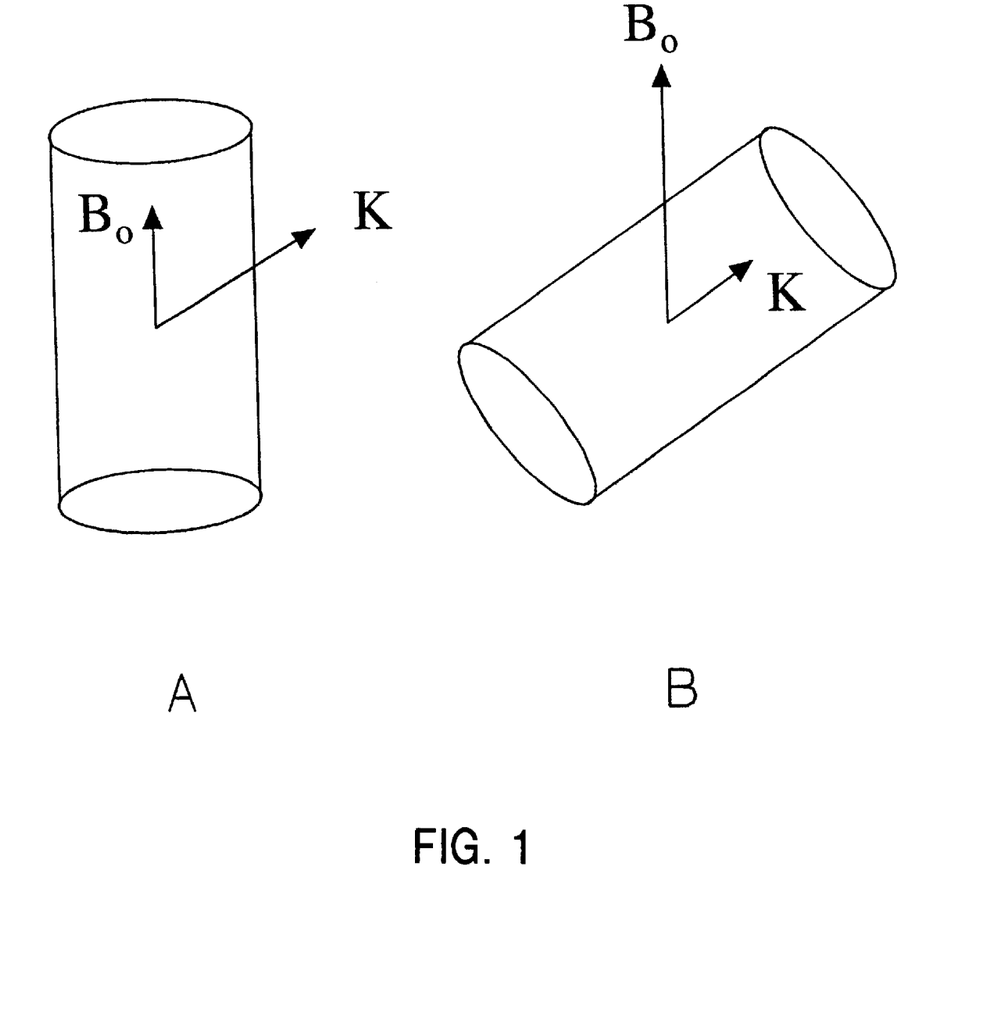
FIG. 1 shows schematic magic angle gradient coil geometries for normal high resolution sample geometry (A) and for samples spinning at the magic angle (B).

The magic angle gradient coil geometries for standard high resolution and MAS applications are illustrated in FIG. 1, where the vector K denotes the direction of the gradient, and B, the main polarizing field. Currents that produce the gradient field are constrained to lie on the surface of the cylinders, and one method used to derive the shape of the currents is by way of the boundary conditions for magnetic fields and surface currents as discussed by Suits and Wilken, J. Phys. E, 22, 565 (1989). In this approach, the component of the gradient field is assigned a linear variation in the desired direction. Additional terms are then added to the gradient magnetic field so that the total field possesses zero divergence and curl, as required by Maxwells equations. Once a consistent gradient field is specified, the surface current J producing such a field is given by $$\mu_o J = e_\rho \times B, \qquad [1]$$

where $e_\rho$ is the outward directed unit vector normal to the cylinderi r or case (A) in FIG. 1, the desired gradient field variation, $G(K \cdot r)e_z$, with the K vector components $(0, \sin\theta, \cos\theta)$, must be augmented with a term along the y axis, so that the total field is be augmented with a term along the y axis, so that the total field is $$B_A(\theta) = G(z\cos\theta + y\sin\theta)e_z + G(z\sin\theta - y\cos\theta)e_y. \qquad [2]$$

Similarly, the augmented field for MAS gradient design in (B) yields a total field $B_B(\theta)=B_A(-\theta)$. The current densities obtained for both types of coils by applying Eq.[1] are therefore closely related to each other. Wire patterns that approximate the desired current densities can be obtained from the contours of the scalar stream function as described by Bowtell and Peters, after suitable truncation that forces the current density to zero outside some finite length along the cylinder axis. This procedure will produce additional terms to the original current density in order to satisfy conservation of charge. Let F(z) represent a general truncating function which goes to zero outside some chosen region about z=0, but is almost constant within that region. Then the general form for the stream function in cylindrical coordinates $\rho,\phi,z$ for a MAS gradient coil will be $$S(\phi, z) = \cos\theta \int_{-\infty}^{z} d\xi \xi F(\xi) - \rho\sin\theta\sin\phi z F(z) + \qquad [3]$$
$$\frac{\rho^2}{4}\cos\theta\cos 2\phi F(z).$$

While the boundary method can produce acceptable coil designs, some amount of iteration is necessary since the currents are being truncated rather than the magnetic field. A more direct approach will start from a truncated magnetic field profile, but this presents difficulties when attempting to obtain consistent field profiles that satisfy Maxwell's equations. For this reason, the Target Field method described by Turner, J. Phys. D, 19, L147 (1986) offers an important alternative route to the design of gradient coils. For NMR applications, the component of the gradient field that is parallel to the main polarizing field contributes to the evolution of the NMR signal, and the Target Field method is simple to implement for coils wound on cylinders coaxial with the polarizing field, as only the z component of the gradient field requires consideration. This allows the target field function to be chosen freely so long as the current density remains finite. For other cylinder orientations, all three components of the gradient field can have non zero projections along the main polarizing field. However, since currents derived from the boundary method will not depend on the radial component, $B_\rho$, the Target Field approach can also neglect this component when choosing a consistent model gradent profile. Consistency for the z and $\phi$ components can then be assured by requiring that the relation $$B_z^{(m)} = -i\left(\frac{\rho}{m}\right)\frac{d}{dz}B_\phi^{(m)} \qquad [4]$$

holds for each Fourier component, m, in the Fourier-Bessel Series expansion of the magnetic fields. For MAS magic angle gradient applications, this consistency relation puts an acceptable target field in the form $$B_z = \cos\theta z F(z) - \rho\sin\theta\sin\phi\frac{d}{dz}(zF(z)) + \frac{\rho^2}{4}\cos\theta\cos 2\phi\frac{d}{dz}F(z) \qquad [5]$$
$$B_\phi = zF(z)\sin\theta\cos\phi - \rho\cos\theta\sin\phi F(z)$$

where F(z) is a suitable truncation function. Truncation of the magnetic field produces a new term in $B_z$ that varies as $\cos 2\phi$ and requires that the z dependance of the $\sin\phi$ term be given by the derivative of the $\phi$ independent term. These changes in the form of the gradient field will reintroduce modulation from sample spinning. This is basically the effect of having the return paths for the current in proximity to the active volume of the gradient coil. After Fourier transformation to k space, the Fourier components $Bz^{(m)}$, can be used to determine the azimuthal current densities via the standard formula given by Turner, current densities via the standard formula given by Turner, $$J_\phi^{(m)}(k) = e^{-\alpha k^2}\frac{B_z^{(m)}(c,k)}{\mu_o k I_m(kc) K_{m'}(ka)} \qquad [6]$$

where a Gaussian apodization factor has been added to ensure finite solutions, and a and c denote the current winding radius and target field radius.

The projection of the gradient magnetic field can then be easily calculated as $$B_z^{(m)}(k)\cos\theta + B_y^{(m)}(k)\sin\theta = \frac{\mu_o a}{2\pi}k I_m(k\rho)\left(-\cos\theta J_\phi^{(m)} K_m(ka) + \frac{1}{2}\sin\theta(J_\phi^{(m-1)}(k)K_{m-1}(ka) + J_\phi^{(m+1)}(k)K_{m+1}(ka))\right) \qquad [7]$$

and after transforming back to z space, the total field can be constructed from $$B(z)=B^{(0)}+2i\,B^{(1)}\sin\phi+2B^{(2)}\cos 2\phi. \qquad [8]$$

Figure 2:
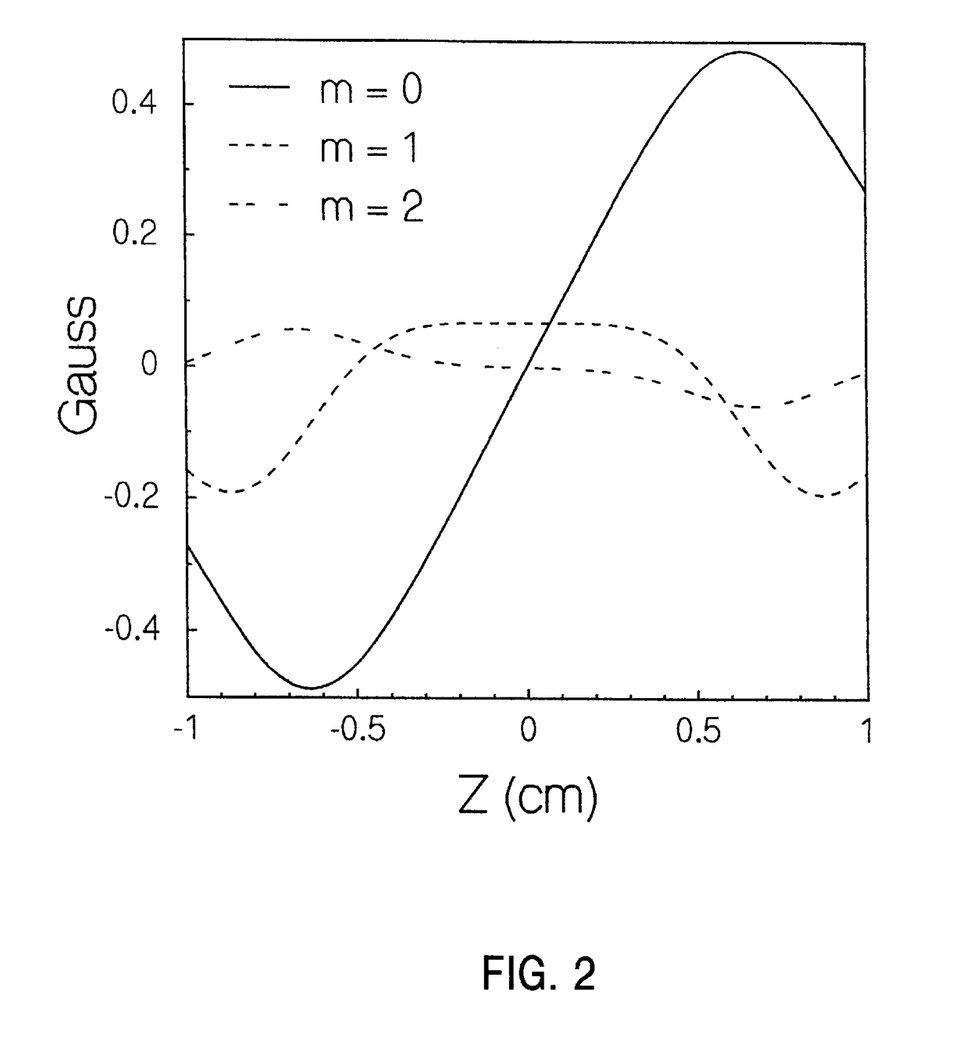
FIG. 2 shows magnetic field profiles for the zero, first and second order harmonics for a magic angle gradient coil with target value of 1 G/cm-A.
Figure 3:
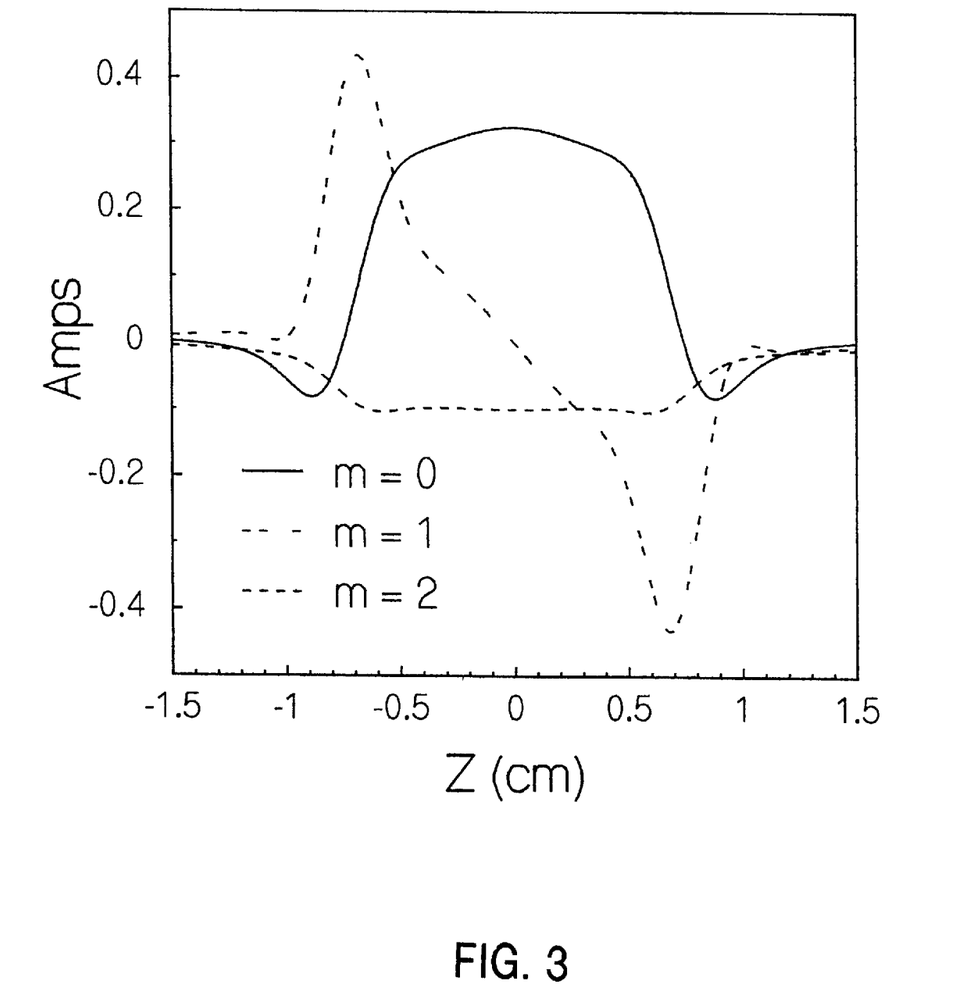
FIG. 3 illustrates integrated current density profiles for the zero, first and second order harmonics for total current is 1.75 Amps.
Figure 4A:
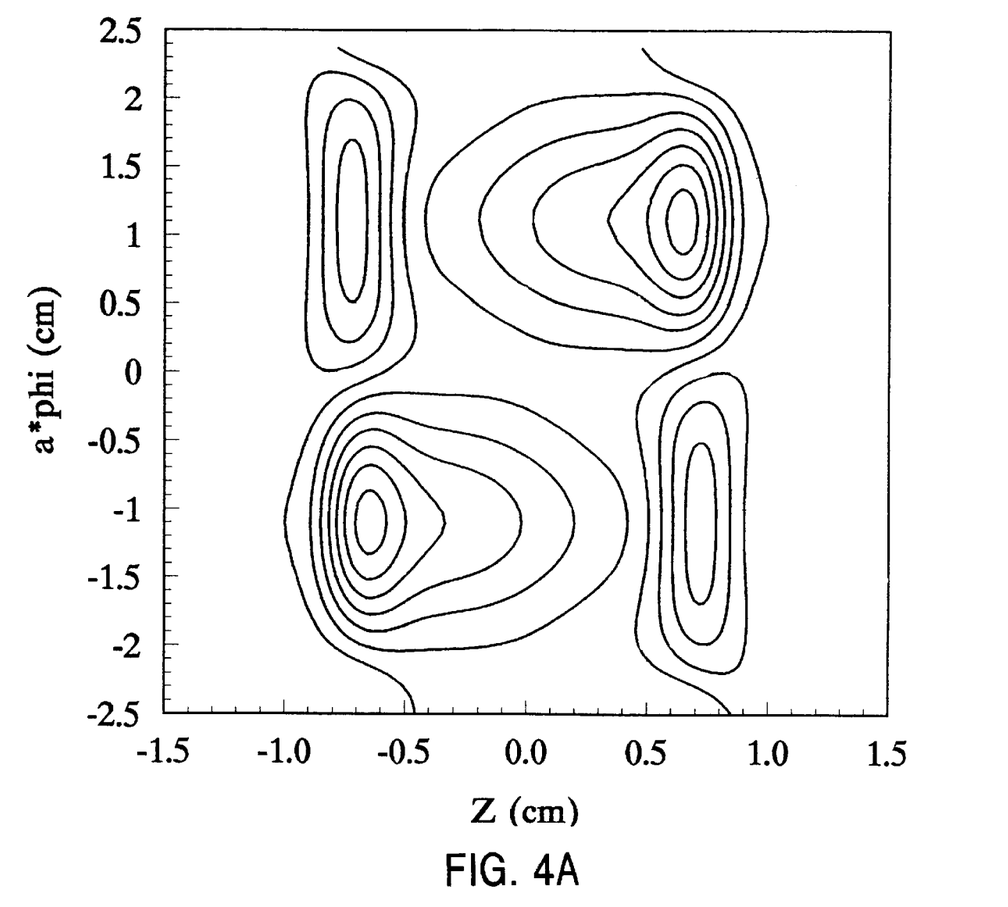
FIG. 4A shows contours for a ten turn coil design resulting in a 5.8 G/cm-amp gradient coil.
Figure 4B:
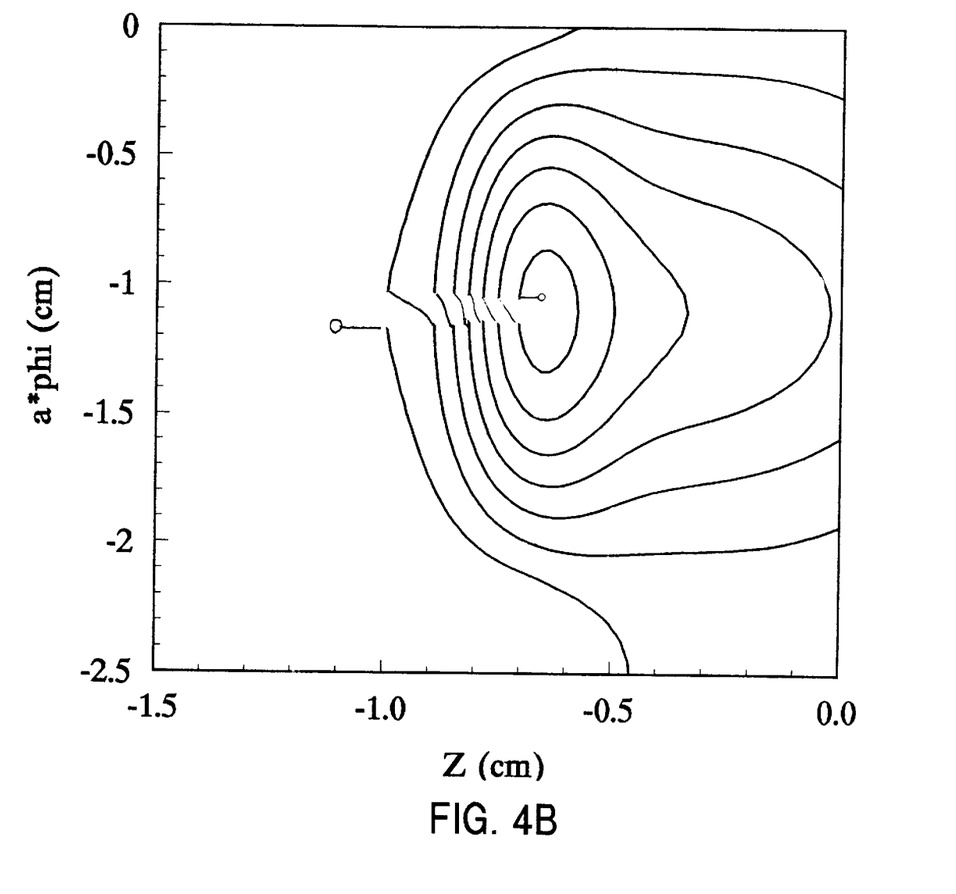
FIG. 4B shows a portion of FIG. 4A realisticaly effectuating series connection of the several contours.
Figure 4C:
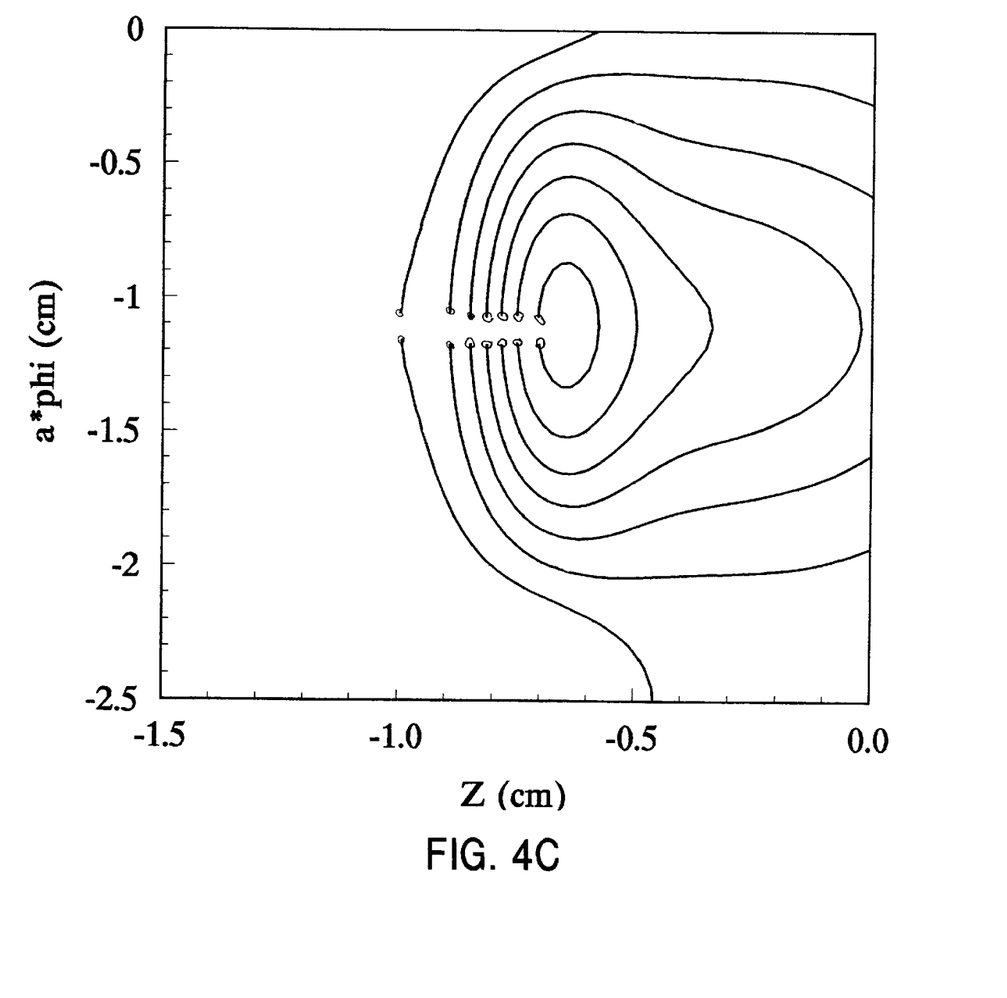
FIG. 4C shows a portion of FIG. 4A realistically effectuating independent excitation of the several contours.
Figure 5:
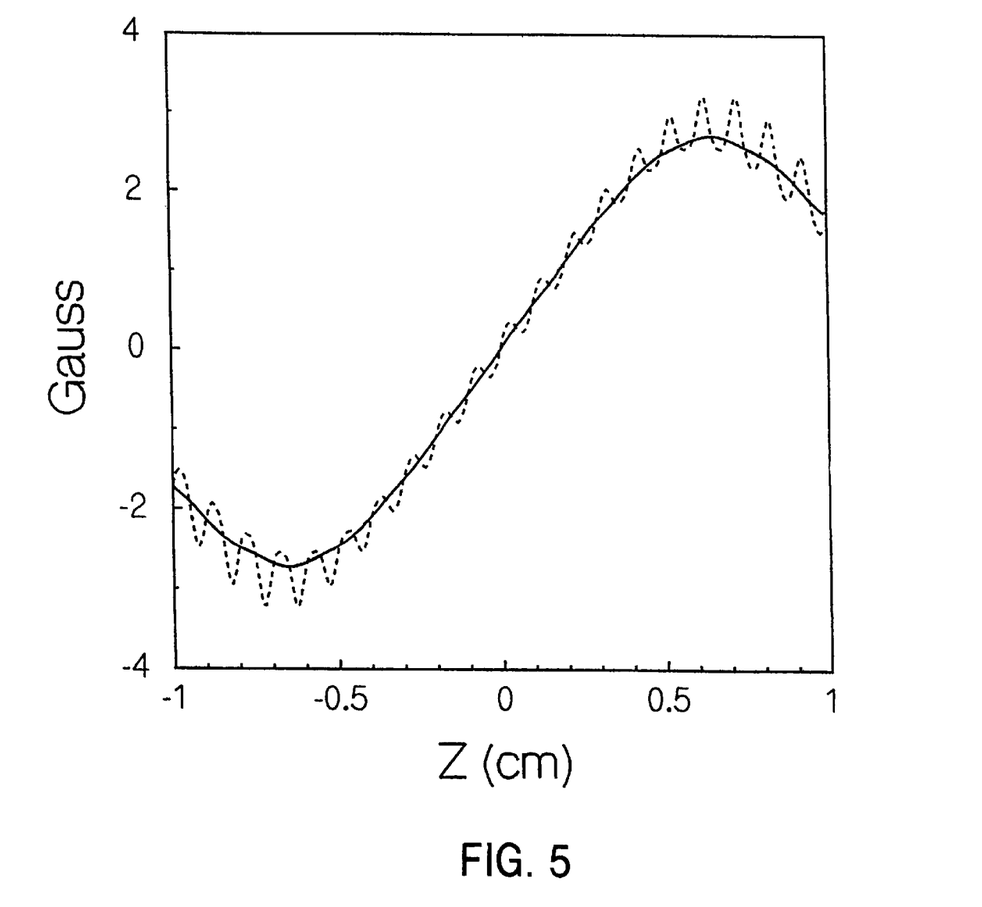
FIG. 5 shows magnetic field profiles for the ten turn coil illustrated in FIG. 4. The field is plotted for a helical trajectory (20 turns) at a radius of 0.01 (solid) and 0.16 cm (dashed).

One interesting choice for a truncation function is the equiripple pile based on Chebychev polynomials). This is because the rippled profile can be smoothed considerably by the Gaussian apodization used to guarantee finite current densities, resulting in useful gradient profiles that cover a broader range of coil former geometries. The field profiles obtained by using Eq.[7] for such a design is shown in FIG. 2. For this design, a coil diameter of 0.7 cm and a target radius of 0.25 cm was used. A scaling length of d=0.4 was used in the sixth order Chebychev truncation function, $$F(z) := \frac{z}{1 + \frac{1}{1000}T_3^2(z/d)} \quad [9]$$

where $T_3(x) = x(4x^2-3)$. A small amount of apodization with $\alpha=0.01$ was used to keep the current densities from diverging for large k. The construction of an actual coil based on the derived current densities requires approximating the continuous current distribution with a finite number of windings. This is accomplished by placing wires along the appropriate contours of the total current distribution, obtained by integrating the current densities, $J_{100}^{(m)}$, along the length of the cylinder and combining them in the same way as for the magnetic field in Eq. [8]. The curves for the integrated current densities, $S^{(m)}$, are illustrated in FIG. 3. These currents are for a gradient strength of 1 G/cm, and when combined to produce the total current distribution, show that 1.79 amps are required. Since an integral number of wire loops are needed in any real coil, the current can be scaled appropriately. The contours, placed at half-odd integer values for a ten amp total winding pattern corresponding to 5.8 G/cm-amp gradient are given in FIG. 4A. The actual gradient performance for the discrete winding pattern will differ from that expected from the continuous distribution as calculated from Eq [7] and displayed in FIG. 4A. The inventive current distribution shown in FIG. 4A is a four poled contour function having full anti-symmetry about a central origin. First and third poles are mutually disposed in diagonal relationship about a central origin and each is surrounded by a respective first plurality of contours. Those contours proximate the respective first and third pole of each said plurality comprise an elliptical-like shape with major axis orthogonal to the Z axis and those contours distal from said first and third poles are relatively more densely spaced in the regions more distant from said central origin than said respective pole and further, these distal contours are relatively sparsely spaced on that side of said respective pole nearer said central origin. Second and fourth poles, diametrically disposed and opposite said first and fourth poles, arc each surrounded by respective second and fourth sets of contours. Those contours, proximate the respective second and fourth pole, each comprise an elliptical like shape of approximately uniform density, with major axis orthogonal to the Z axis and the major axes of the contours corresponding to the second and fourth poles are long compared to respective contours surrounding each first and fourth poles. A graph of the gradient field for a spiral trajectory on and off axis, as calculated for the wire pattern, is given in FIG. 5. The solid line indicates the field resulting for a 20 turn helical trajectory at a radius of 0.01 cm and the dashed curve shows the field at a radius of 0.16 cm. In this case, the magnetic field was calculated by approximating the curves with short wire segments and using the standard formulas for finite wire segments. The axial curve very closely fits that obtained via the continuous current distribution. Off the axis, however, the 0.2 Gauss amplitude of the modulation components at the coil center is about 2.5 times larger than that expected from FIG. 4A. This is the apparent result of the passage from continuous currents to discrete currents.

Figure 6:
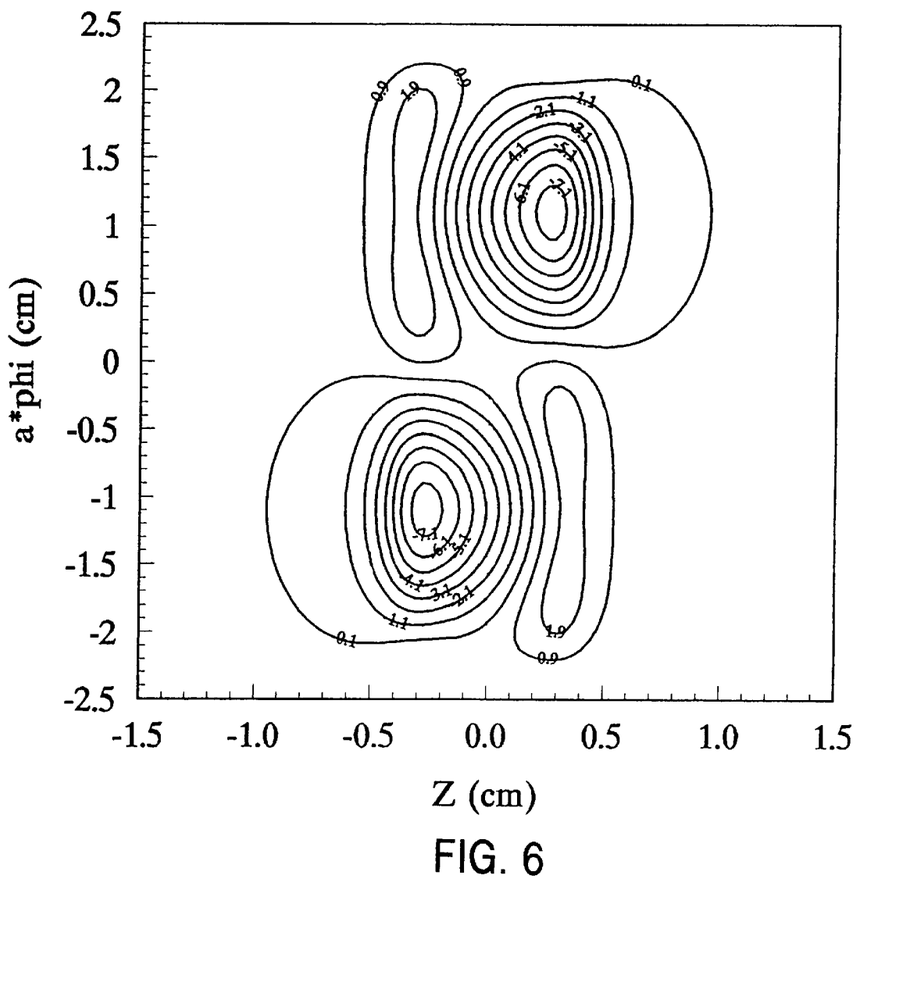
FIG. 6 shows another arrangement of coils wherein boundary conditions are applied to the current distribution to obtain a satisfactory gradient along the cylindrical axis in the space available.

The contours shown in FIG. 6 differ from those of FIG. 4A in that the equ. 3 is applied to the same dimensional constraints for obtaining the truncated current distribution. The truncation function in this case will be of the form $(1+(z/d)^6)^{-1}$ with d=0.45 cm.

The contours representing the current paths may be deposited upon a cylindrical surface or upon a flexible planar surface and rolled into cylindrical form following conventional practice. The contours are shown as closed paths, but each path is broken to provide for serial connection to the adjacent current contour in the preferred embodiment, as indicate by dotted lines. (The current paths may indeed be closed paths for superconducting coils, allowing for electrical access for the initialization of the current.) In another embodiment, each contour-current loop is broken to permit electrical access independently to that current loop. Whereas, in the case of the preferred embodiment, a single current value characterizes the circuit comprising the series connected loops, the independently excited permits adjustment of the current for each contour. Where the same value of current is supplied to the several contours, the method of calculation is as above described. The advantage of independent adjustment of the current magnitude of each loop lies in the placement of each loop. If, for example, each loop had its own individually adjusted current, the current surface could be approximated by a uniform distribution of loops. In like manner, a more dense distribution of loops could be used if each carried a relatively small fraction of unit current.

The extension of the Target Method presented here can also be used to design efficient gradient coils for sample geometries using horizontal solenoid RF coils, and by adding an additional current layer, the gradient coils can be designed for shielding the exterior field while preserving the interior field gradient linearity.

Although described in terms of the above illustrative embodiment, other enhancements and modifications will be apparent to those skilled in the art, and these enhancements and modifications are covered by the claims set out below.

What is claimed is:

1. A coil for a magnetic resonance apparatus disposed on the curved surface of a cylinder of radius r to provide a substantially linear magnetic field gradient along the cylindrical axis z, wherein said cylindrical axis z is oriented at a desired angle with respect to another, uniform, magnetic field direction, comprising a discrete electrical current distribution disposed on said curved surface, said discrete electrical current distribution being the discrete realization of a four poled contour function having full anti-symmetry about a central origin, first and third poles mutually disposed in diagonal relationship and each surrounded by a respective first plurality of contours forming first discrete electrical current paths, those contours proximate the respective pole of each said plurality comprising an elliptical-like shape with major axis orthogonal to said cylindrical axis and those contours distal from said poles relatively densely spaced in the regions more distant from said central origin than said pole and relatively sparsely spaced on the side of said pole nearer said central origin, second and fourth poles mutually disposed in diagonal relationship about said central origin and each surrounded by a respective second plurality of contours forming second discrete electrical current paths, those contours proximate the respective pole of each said plurality comprising an elliptical-like shape with major axis orthogonal to said cylindrical axis, each said contour associated with said second and said fourth poles forming second discrete electrical current paths opposite in electrical sense to said first discrete current paths.

2. The coil of claim 1 wherein each said contour contains a break in the contour to adapt for serial communication to an adjacent contour.

3. The coil of claim 1 wherein each said contour contains a break in the contour to adapt for receiving electrical excitation independently from other contours.

4. The coil of claim 1 wherein each said contour associated with second and fourth poles forming second electrical current paths opposite in electrical sense to said first discrete electrical current paths.

5. A magnetic resonance probe for chemical analysis of a sample disposed in a magnetic field having a first orientation, comprising
   (a) magnetic gradient generator to establish a magnetic field gradient at a desired angle with respect to said first orientation, further comprising coils disposed on the surface of a cylinder, said cylinder axis coincident with said desired angle,
   (b) said coils defining a discrete electrical current distribution, said discrete electrical current distribution being the discrete realization of a four poled contour function having full anti-symmetry about a central origin,
      first and third poles mutually disposed in diagonal relationship and each surrounded by a respective first plurality of contours forming first discrete electrical current paths, those contours proximate the respective pole of each said plurality comprising an elliptical-like shape with major axis orthogonal to the cylindrical axis and those contours distal from said poles relatively densely spaced in the regions more distant from said central origin than said pole and relatively sparsely spaced on the side of said pole nearer said central origin,
      second and fourth poles mutually disposed in diagonal relationship about said origin and each surrounded by a respective second plurality of contours forming second discrete electrical current paths, those contours proximate the respective pole of each said plurality comprising an elliptical-like shape with major axis orthogonal to the cylindrical axis and each said contour associated with second and fourth poles forming second electrical current paths opposite in electrical sense to said first discrete current paths.

6. A magnetic resonance probe of claim 5 wherein each said contour associated with second and fourth poles forming second electrical current paths opposite in electrical sense to said first discrete current paths.

* * * * *